United States Patent
Chiou et al.

(10) Patent No.: US 6,552,369 B2
(45) Date of Patent: Apr. 22, 2003

(54) LIGHT EMITTING DIODE AND FABRICATING METHOD THEREOF

(75) Inventors: Shu-Woei Chiou, Miaoli (TW); Holin Chang, Kaohsiung (TW); Tzer-Perng Chen, Hsinchu (TW); Chih-Sung Chang, Taipei (TW)

(73) Assignee: United Epitaxy Company LTD (TW)

( * ) Notice: Subject to any disclaimer, the term of this patent is extended or adjusted under 35 U.S.C. 154(b) by 0 days.

(21) Appl. No.: 10/003,923

(22) Filed: Oct. 31, 2001

(65) Prior Publication Data

US 2002/0055218 A1 May 9, 2002

(30) Foreign Application Priority Data

Nov. 3, 2000 (TW) ...................................... 89123252 A

(51) Int. Cl.⁷ .............................................. H01L 33/00
(52) U.S. Cl. ......................................... 257/98; 257/103
(58) Field of Search .............................. 257/94, 98, 103

(56) References Cited

U.S. PATENT DOCUMENTS

| | | | | |
|---|---|---|---|---|
| 5,825,796 A | * | 10/1998 | Jewell et al. | .................. 372/45 |
| 6,040,590 A | * | 3/2000 | OBrien et al. | ................. 257/94 |
| 6,046,465 A | * | 4/2000 | Wang et al. | .................... 257/98 |
| 6,057,563 A | * | 5/2000 | Chen et al. | .................... 257/97 |
| 6,169,296 B1 | * | 6/2001 | Kamiyama et al. | ........... 257/94 |
| 6,373,188 B1 | * | 4/2002 | Johnson et al. | ............. 313/506 |
| 2002/0097764 A1 | * | 7/2002 | Jewell | .......................... 372/46 |

OTHER PUBLICATIONS

Wafer–Bonded AlGaInP/Au/AuBe/SiO2/Si Light Emitting Diodes: Horng et al., Jpn. J. App. Phys., vol. 39 (2000) Pt. 1, No. 4B, pp. 2357–2359.

AlGaInP Light–Emitting Diodes with Mirror Substrates Fabricated by Wafer Bonding, R. H. Horng et al., Applied Physics Letters, vol. 75, No. 20, Nov. 15, 1999, pp. 3054–3056.

AlGaInP/AuBe/glass Light–Emitting Diodes Fabricated by Wafer Bonding Technology R.H. Horng et al., Applied Physics Letters, vol. 75, No. 2, Jul. 12, 1999, pp. 154–156.

High–Brightness InGaAIP Green Light–Emitting Diodes H. Sugawara et al., Appl. Phys. Lett. 61 (15, Oct. 12, 1992, pp. 1775–1777.

Very High–Efficiency Semiconductor Wafer–Bonded Transparent–Substrate (AlxGa1–x)0.5In0.5P/GaP Light–Emitting Diodes; F. A. Kish et al., Appl. Phys. Lett. 64 (21) May 23, 1994 pp. 2839–2841.

* cited by examiner

Primary Examiner—Carl Whitehead, Jr.
Assistant Examiner—William C. Vesperman

(57) ABSTRACT

A light emitting diode (LED) is disclosed. An emitted light can be prevented from being absorbed by a substrate using a Bragg reflector layer with high reflectivity. The present invention provides a Bragg reflector layer comprising a plurality of high aluminum-containing AlGaAs/AlGaInP layers or high aluminum-containing AlGaAs/ low aluminum-containing AlGaInP layers formed on the substrate before the epitaxial structure of the light emitting diode being formed. Since the high aluminum-containing AlGaAs is oxidized and formed an oxide of a lower refraction index, the reflectivity and high reflection zones of the oxidized Bragg reflector layer are much larger. According to the electrical insulation characteristic of the oxide, the Bragg reflector layer can limit the current within the oxidized regions of high aluminum-containing AbGaAs layer. Therefore, the aforementioned light emitting diode structure has a higher brightness than the conventional light emitting diode.

17 Claims, 5 Drawing Sheets

US 6,552,369 B2

LIGHT EMITTING DIODE AND FABRICATING METHOD THEREOF

FIELD OF THE INVENTION

The present invention relates to a light emitting diode (LED) chip structure and a fabricating method thereof, and more particularly relates to a LED chip structure using a Bragg reflector layer with high reflectivity for increasing the brightness of an LED.

BACKGROUND OF THE INVENTION

The conventional AlGaInP light emitting diode, as shown in FIG. 1, has a double heterostructure (DH), and is composed of an n-type $(Al_xGa_{1-x})_{0.5}In_{0.5}P$ lower cladding layer 4 having an Al composition of about 0.7 to about 1.0 and is formed on an n-type GaAs substrate 3; an $(Al_xGa_{1-x})_{0.5}In_{0.5}P$ active layer 5; a p-type $(Al_xGa_{1-x})In0.5P$ upper cladding layer 6 having an Al composition of about 0.7 to about 1.0; and a p-type high energy gap GaP or AlGaAs window layer 7. The emitting wavelength from the conventional LED structure can be varied by changing the composition of the active layer 5, and the wavelength thereof can be changed from 650 nm of red light to 555 nm of pure green light. However, one disadvantage of the conventional light emitting diode is that, when the light generated in the active layer is emitted deep into the GaAs substrate, the light is easily absorbed by the GaAs substrate since the GaAs substrate has a smaller energy gap. Accordingly, an LED with high efficiency cannot be fabricated.

Several conventional techniques about light emitting diodes have been disclosed for preventing the light from being absorbed by the substrate. However, these conventional techniques still have some disadvantages and limitations. For example, the method disclosed by Sugawara et al. and published in Appl. Phys. Lett., vol. 61, 1775–1777 (1992), is to add a distributed Bragg reflector (DBR) layer to a GaAs substrate for reflecting the light entering the GaAs substrate thereby decreasing the light absorbed by the GaAs substrate. However, because the DBR layer can only effectively reflect the light approximately vertical to the GaAs substrate, the efficiency thereof is not very good.

Kish et al. disclosed a wafer-bonded transparent-substrate (TS) $(Al_xGa_{1-x})_{0.5}In_{0.5}P/Gap$ light emitting diode [Appl. Phys Lett. vol. 64, no. 21, 2839 (1994);" Very High-Efficiency Semiconductor Wafer-Bonded Transparent-Substrate $(Al_xGa_{1-x})_{0.5}In_{0.5}P/Gap$"], wherein the TS AlGaInP LED is fabricated by growing a very thick (about 50 μm) p-type GaP window layer with the method of hydride vapor phase epitaxy (HVPE) at a temperature above the eutectic point of AuSn solder. After bonding, the n-type GaAs substrate is selectively removed by using conventional chemical etching techniques. The exposed n-type layers are subsequently bonded to an n-type GaP substrate of 8–10 mil in thickness. The resulting TS AlGahiP LED exhibits a two-fold improvement in light output in comparison with the absorbing substrate (AS) AlGaInP LED. However, the fabrication process of TS AlGahnP LED is too complicated. Therefore, it is difficult to manufacture the TS AlGaInP LED with high yield and low cost.

Horng, et al. reported a mirror-substrate (MS) AlGaInP/ metal/$SiO_2$/Si light emitting diode fabricated by a wafer-fused technique [Appl. Phys. Lett. Vol. 75, No. 20, 3054 (1999); "AlGaInP Light-Emitting Diodes with Mirror Substrates Fabricated by Wafer Bonding"], wherein AuBe/Au is used as the adhesive to bond the Si substrate and light emitting diode epilayers. However, the luminous intensity of the MS AlGaInP LED is only about 90 mcd with 20 mA injection current, which is 40% lower than that of the TS AlGaInP LED. Besides, both the p-electrode and the n-electrode are formed on the same side, so that the chip size cannot be decreased. Therefore, the chip size is larger than the conventional LED chip that has a p-electrode on one side and a n-electrode on the other side. Thus, this type of LED chip can hardly satisfy the trend of package size being moved toward miniaturization.

SUMMARY OF THE INVENTION

As described above, conventional light emitting diodes have many disadvantages. Therefore, the present invention provides a light emitting diode structure and a fabricating method thereof to solve the disadvantages of the conventional light emitting diodes.

It is an object of this invention to provide a light emitting diode structure and a fabricating method thereof. This invention can prevent emitted light from being absorbed by a substrate by using a high reflectivity Bragg reflector layer.

It is another object of this invention to provide a light emitting diode structure and a fabricating method thereof. The present invention provides a Bragg reflector layer by forming a high aluminum-containing AlGaAs/AlGaInP layer or a high aluminum-containing AlGaAs/low aluminum-containing AlGaAs layer on the substrate before the epitaxial structure of the light emitting diode is formed. Because the high aluminum-containing AlGaAs has the featuree of easy oxidation, the high aluminum-containing AlGaAs can be oxidized to form an oxide having a lower refraction index. Thus, the reflectivity and high reflection zones of the oxidized Bragg reflector can be much larger than those of the conventional DBR.

It is another object of this invention to provide a light emitting diode structure and a fabricating method thereof. Since the oxidized AlGaAs layer is electrically insulated, the Bragg reflector layer thus will limit the current within the non-oxidized regions of high aluminum-containing AlGaAs layer. Furthermore, the thickness of the lower cladding layer must be greater than 0.5 μm to achieve uniform current density in the active layer, whereby the light intensity in this chip is uniform and not restricted in the center region. Comparing to the conventional LED, the light intensity can be drastically improved because most of light emitted backward can be reflected by the oxidized Bragg reflector having high reflectivity.

In accordance with all aspects of this invention, the invention provides a structure of a light emitting diode, comprising: a substrate having a first electrode on a first surface, an epitaxial structure forming on a second surface, wherein the epitaxial structure is formed by a plurality of III-V compound semiconductor epitaxial layers including an active layer and a Bragg reflector layer sandwiched between the active layer and the substrate, and a portion of the Bragg reflector layer is oxidized, and a second electrode formed on the epitaxial structure.

In accordance with all aspects of this invention, this invention provides a method for forming a light emitting diode, comprising the steps of: providing a substrate; forming an epitaxial structure on a first surface of the substrate, wherein the epitaxial structure is formed by a plurality of III-V compound semiconductor epitaxial layers including an active layer and a Bragg reflector layer sandwiched between the active layer and the substrate; conducting a treatment of oxidation for forming a high reflectivity and a current insulating layer in a portion of the Bragg reflector layer; forming a first electrode on a second surface; and forming a second electrode on the epitaxial structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a light emitting diode structure and a fabricating method thereof, and is described in details as follows.

Figure 2:
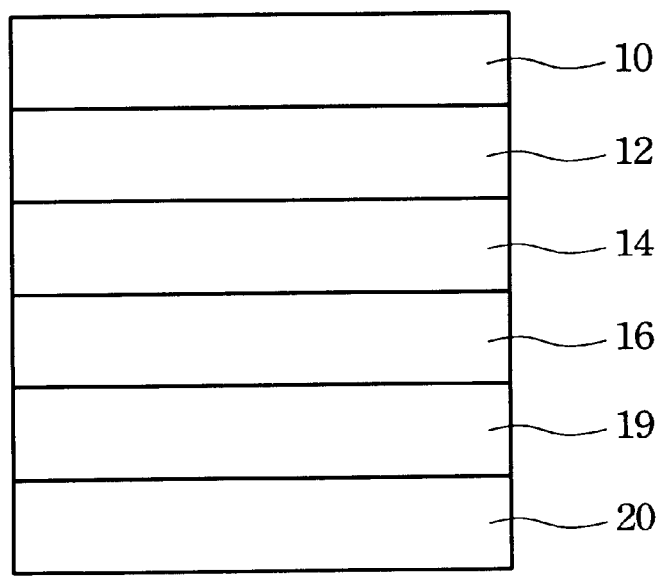
FIG. 2 is a schematic diagram showing an epitaxial structure of a light emitting diode structure of the present invention.

Referring to FIG. 2, according to the present invention, the epitaxial structure of the light emitting diode is composed of an n-type GaAs substrate 20; a Bragg reflector layer 19; an n-type $(Al_xGa_{1-x})_{0.5}In_{0.5}P$ lower cladding layer 16 with the Al composition of about $0\square\times\square0.45$; a $(Al_xGa_{1-x})_{0.5}In_{0.5}P$ with the Al composition of about $0\square\times\square0.45$; a p-type $(Al_xGa_{1-x})_{0.5}In_{0.5}P$ upper cladding layer 12; and a p-type ohmic contact layer 10.

Figure 1:
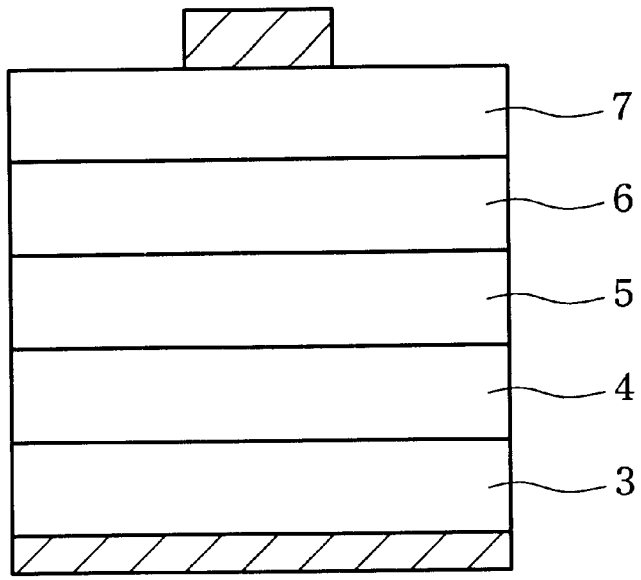
FIG. 1 is a schematic diagram showing a conventional structure of a light emitting diode.

In the above description, the ratio of the compound such as $(Al_xGa_{1-x})_{0.5}In_{0.5}P$ is merely shown as an example, as the present invention is not limited thereto. In addition, the structure of the AlGaInP active layer 14 of the invention could be a DH structure or a multiple quantum well (MQW) structure. The DH structure comprises the n-type $(Al_xGa_{1-x})_{0.5}In_{0.5}P$ lower cladding layer 16 with the Al composition of about $0.5 \leq x \leq 1$, a $(Al_xGa_{1-x})_{0.5}In_{0.5}P$ active layer 14 and a p-type $(Al_xGa_{1-x})_{0.5}In_{0.5}P$ upper cladding layer 12 with the Al composition of about $0.5 \leq x \leq 1$, as shown in FIG. 1.

According to the embodiment of the present invention, the Bragg reflector layer 19 is sandwiched between the n-type GaAs substrate 20 and the lower cladding layer 16. The Bragg reflector layer 19 comprises a plurality of stacked structure of high aluminum-containing AlGaAs/AlGaInP layers or high aluminum-containing AlGaAs/low aluminum-contained AlGaInP layers. After the oxidation of the Bragg reflector layer is process, the oxide formed is an insulator with a low refraction index, and the Bragg reflector, which is formed as described above, can reflect the emitted light generated by the active layer 14. The thickness of each layer can be designed to equal $)\lambda/4$ n, wherein the $\lambda$ is the wavelength of the emitted light and the n is the refractive index.

Figure 3:
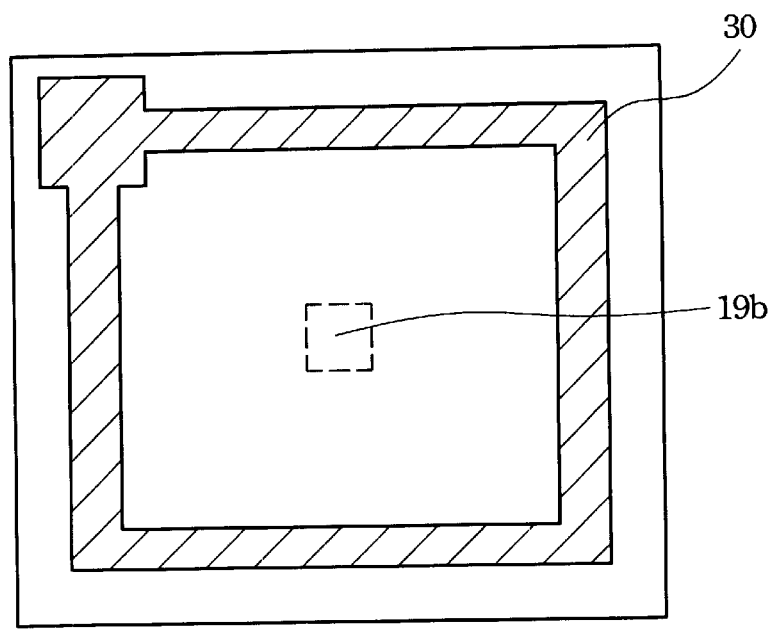
FIGS. 3A and 3B illustrate the first embodiment of the present invention showing the top view and the cross sectional view of the light emitting diode.
Figure 3:
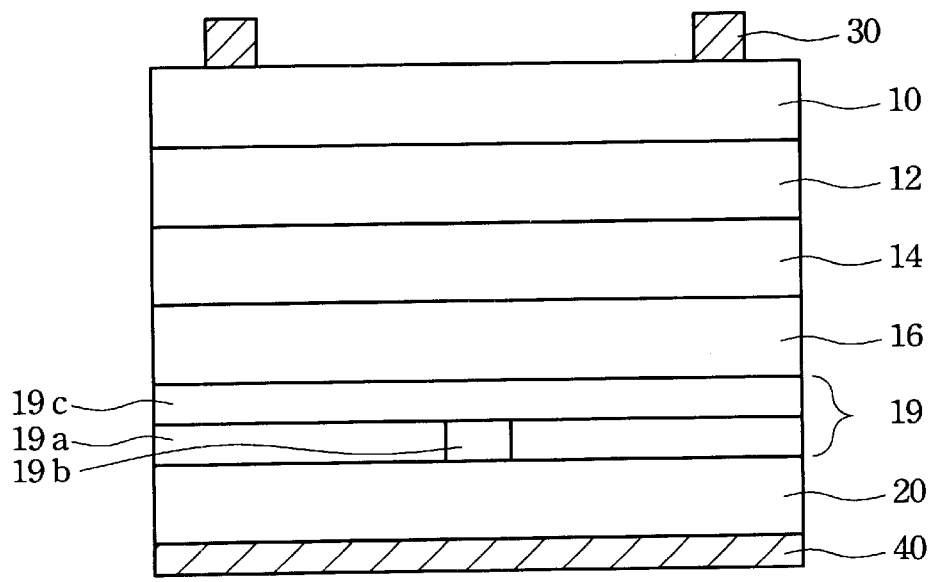

Referring to FIGS. 3A and 3B, the first embodiment of the present invention shows the top view and the cross sectional view of the light emitting diode. In this embodiment, the Bragg reflector layer 19 comprises three pairs of high aluminum-containing AlGaAs/AlGaInP 19c layer. Due to the feature of easy oxidization of the high aluminum-containing AlGaAs layer, a treatment of oxidation is processed onto the high aluminum-containing AlGaAs layer. With the temperature controlled between 300 and 600 degrees. C, an $Al_xO_y$ layer 19a is formed on the lateral portion of the high aluminum-containing AlGaAs layer toward the central portion, and a non-oxidized region of high aluminum-containing AlGaAs layer 19b is located in the center. Finally, an n-electrode 40 and a p-electrode 30 are respectively formed on the n-type GaAs substrate 20 and the p type ohmic contact layer 10.

Figure 4:
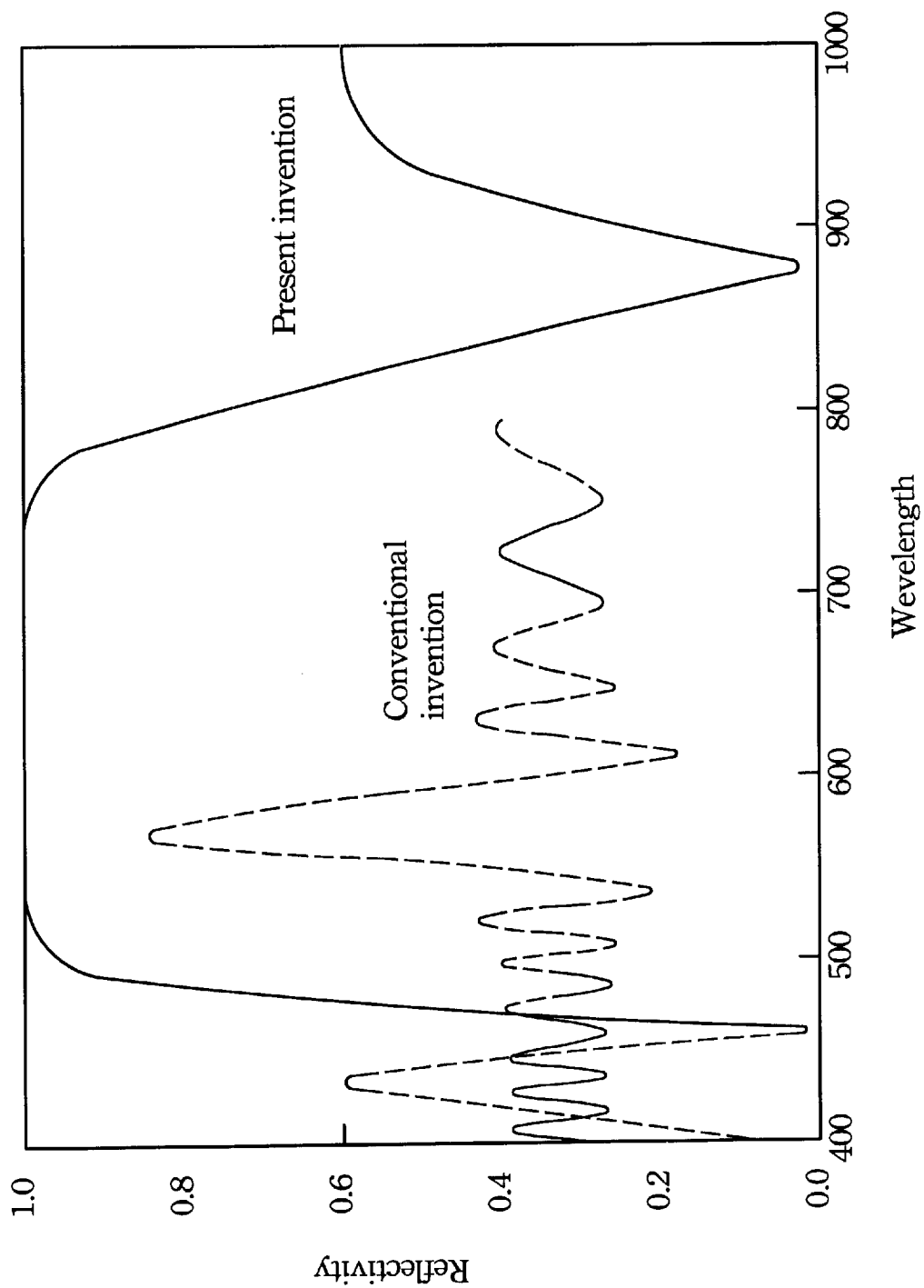
FIG. 4 shows the reflectivity and the injected wavelength onto the Bragg reflector 25 in the present invention and prior art.

After the treatment of oxidation, the refraction index of the $Al_xO_y$ layer 19a is 1.6, which is different from the reflective index of low aluminum-containing AlGaAs or AlGaInP of about higher than 3. Consequently, the wavelength reflected by the Bragg reflector layer 19 can cover almost the entire visible spectrum between 500~800 nm, as shown in FIG. 4. The Bragg reflector layer 19 can thus reflect almost 100% of the emitted light generated by the active 14. Moreover, according to the electrical insulation characteristic of the $Al_xO_y$ layer 19a, the Bragg reflector layer can limit the current within the non-oxidized regions of the high aluminum-containing AlGaAs layer 19b. Because most of the light can be reflected by the Bragg reflector layer 19 due to the lower cladding layer 16 inserted between the Bragg reflector layer 19 and the active layer 14, the current in the active layer 14 is thus uniform. Accordingly, the light intensity can be greatly increased.

When the confined current runs through the corresponding region of the active layer 14, the intensity of light emitted by the active layer 14 is higher than before. According to the factors described above, the light intensity of the present invention is apparently improved. The Bragg reflector layer shown in this embodiment is sandwiched between the n-type GaAs substrate and the lower cladding layer, but the present invention is not limited thereto. The Bragg reflector layer can also be located in the lower cladding layer.

Figure 5:
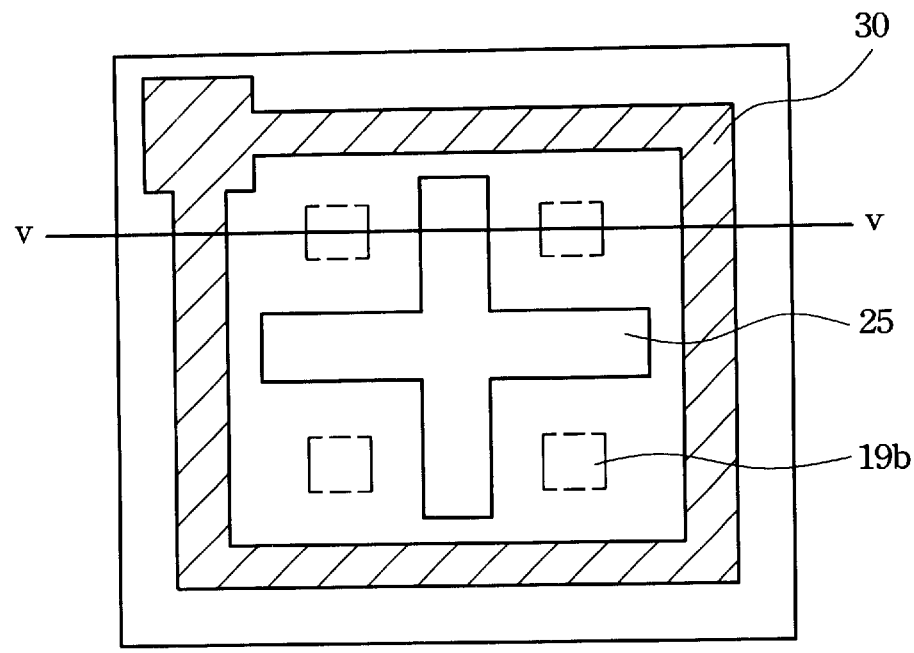
FIGS. 5A and 5B illustrate the second embodiment of the present invention showing the top view and the cross sectional view taking along line V-V in FIG. 5A.
Figure 5:
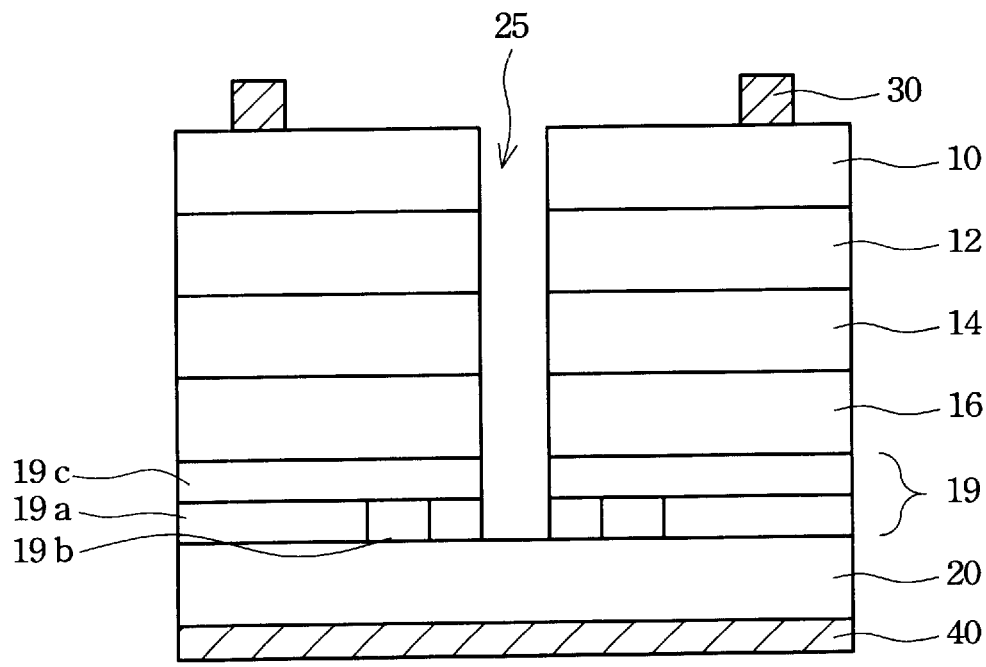

Referring to FIGS. 5A and 5B, the second embodiment of the present invention shows the top view of the light emitting diode and the cross sectional view of the light emitting diode taken along the line V—V of FIG. 5A. In this embodiment, the Bragg reflector layer 19 comprises several pairs of high aluminum-containing AlGaAs/AlGaInP or high aluminum-containing AlGaAs/low aluminum-containing AlGaAs layer 19c. In order to decrease the oxidation time, the present invention forms a cross concavity 25 by etching to the n-type GaAs substrate 20 for separating four portions of Bragg reflector layer 19. Thus, more reaction areas of the high aluminum-containing AlGaAs can be reacted during the oxidation treatment. With a careful control, a plurality of AlxOy layers 19a are formed on the lateral portion of the high aluminum-containing AlGaAs layer, and a plurality of non-oxidized AlAs layers 19b are located in the center. Finally, an n-electrode 40 and a p-electrode 30 are respectively formed on the n-type GaAs substrate 20 and the p-type ohmic contact layer 10. Furthermore, the AlGaInP 19c layer can be replaced by a low aluminum-containing AlGaAs layer to form the Bragg reflector layer 19. The advantage of this embodiment is that each cell is separated into four regions, and only half of the oxidation time is needed in comparison with the first embodiment.

As shown in FIG. 4, a comparison between the Bragg reflector layer of the present invention and the prior art is shown. The reflectivity of the conventional Bragg reflector layer comprising an AlGaInP/AlInP layer is 80% only in the regions of 550~600 nm in wavelength, and is poor in the other regions. On the other hand, the reflectivity of the Bragg reflector layer of the present invention comprising a high aluminum-containing AlGaAs/AlGaInP layer or an high aluminum-containing AlGaAs/low aluminum-containing AlGaInP, is almost 100% in the region of 500~800 nm in wavelength. The Bragg reflector layer of the present invention thus has a higher reflectivity.

Figure 6:
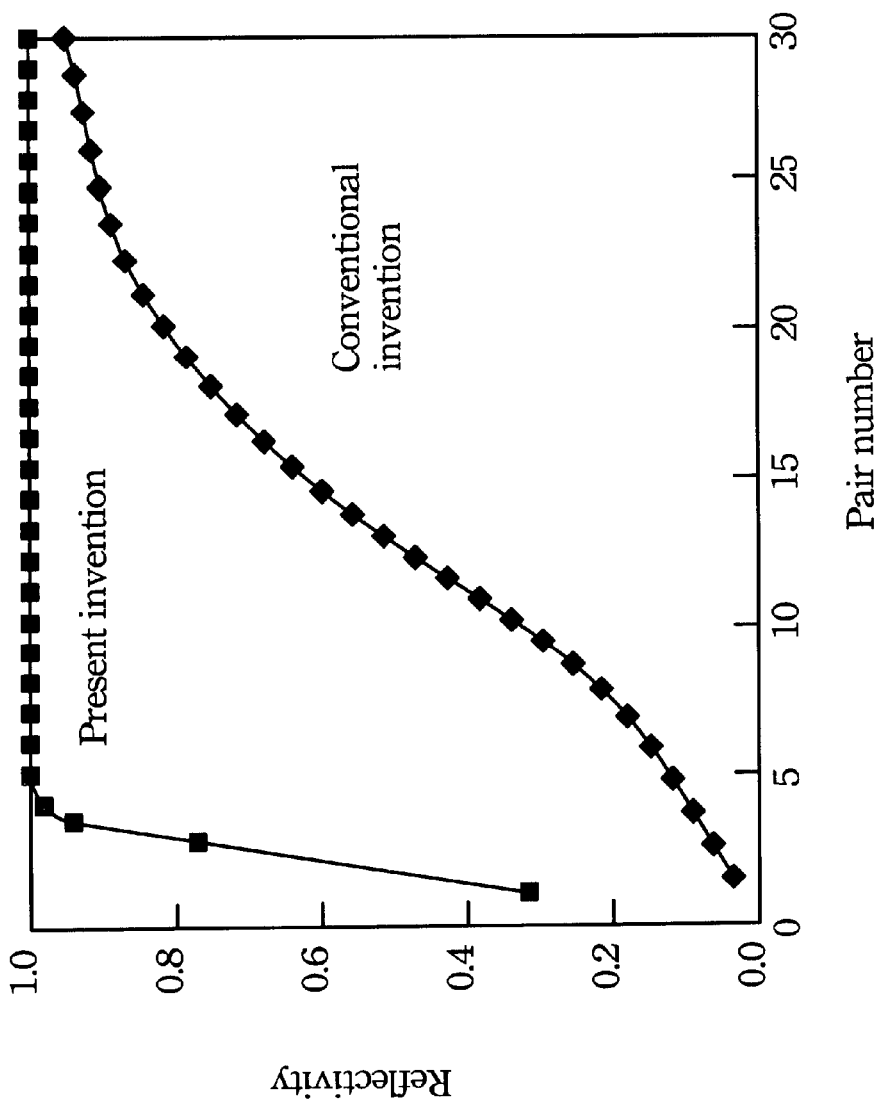
FIG. 6 shows the relationship between the reflectivity and the pair number of the Bragg reflector layer in the present invention and prior art.

Referring FIG. 6, the reflectivity and the number of pairs in the Bragg reflector layer in the present invention and those of the prior art are shown. In the present invention, 4 pairs of high aluminum-containing AlGaAs/AlGaInP layers or high aluminum-containing AlGaAs/low aluminum-containing AlGaInP layers of the Bragg reflector layer can obtain a high reflectivity of about 100%. In contrast, 20 pairs of AlGaInP/AlInP layers of the conventional Bragg reflector can only obtain a poor reflectivity of 80%. The structure of the present Bragg reflector layer is thus simpler and the reflectivity is higher than the conventional Bragg reflector layer.

Due to the features of the Bragg reflector of the present invention, the present invention not only can be applied to the AlGaInP light emitting diode but also can be applied further to all light emitting diodes that can emit visible light.

Therefore, it is an advantage of this invention to provide a light emitting diode structure and a fabricating method thereof. Hence, an emitted light can be prevented from being absorbed by a substrate using a high reflectivity Bragg reflector layer.

It is another advantage of this invention to provide a light emitting diode structure and a fabricating method thereof. The present invention provides a Bragg reflector layer, which is an high aluminum-containing AlGaAs/AlGaInP layer or a high aluminum-containing AlGaAs/low aluminum-containing AlGaAs, formed on the substrate before the epitaxial structure of the light emitting diode. Due to the feature of easy oxidization of the high aluminum-containing AlGaAs and the higher refraction index of the oxide, the wavelength reflected by the Bragg reflector layer can cover almost the entire visible spectrum.

It is another advantage of this invention to provide a light emitting diode structure and a fabricating method thereof. According to the electrical insulation characteristic of the oxide, the Bragg reflector layer can limit the current within the oxidized regions of high aluminum-containing AlGaAs layer.

While the preferred embodiment of the invention has been illustrated and described, it will be appreciated that various changes can be made therein without departing from the spirit and scope of the invention.

What is claimed is:

1. A structure of a light emitting diode (LED), comprising:
    a substrate having a first surface on one side and a second surface on the other side, wherein a first electrode has been formed on said first surface;
    an epitaxial structure forming on said second surface, wherein said epitaxial structure is formed by a plurality of III-V compound semiconductor epitaxial layers including an active layer and a brag reflector layer sandwiched between said active layer and said substrate, and said Bragg reflector layer comprises:
       at least one oxidizble layer, wherein a portion of said at least one oxidizable layer is oxidized, thereby forming a current insulating layer; and
       at least one semiconductor layer, wherein said at least one semiconductor layer and said at least one oxidizable layer are stacked on each other wherein said oxidizable layer is easier to oxidize than said semiconductor layer; and
    a second electrode formed on said epitaxial structure.

2. The structure according to claim 1, wherein said at least one semiconductor layer is at least one AlGaInP layer.

3. The structure according to claim 1, wherein said at least one semiconductor layer is at least one AlGaInP layer.

4. The structure according to claim 1, wherein said oxidizable layer is a high contained AlGaAs layer.

5. The structure according to claim 1, wherein aluminum composition of said at least one oxidizable layer is between about 80% and about 100%.

6. A method forming a light emitting diode, comprising the steps of:
    providing a substrate;
    forming an epitaxial structure on a first surface of said substrate, wherein said epitaxial structure is formed by a plurality of III-V compound semiconductor epitaxial layers including an active layer and a Bragg reflector layer sandwiched between said active layer and said substrate;
    conducting a treatment of oxidation for forming a high reflectivity and current insulating layer in a portion of said Bragg reflector layer;
    forming a first electrode on a second surface of said substrate; and
    forming a second electrode on said epitaxial structure.

7. The method according to claim 6, wherein said Bragg reflector layer comprises at least one oxidizable layer and at least one semiconductor layer stacked each other.

8. The method according to claim 7, the method further comprises a step of etching said epitaxial structure and said Bragg reflector layer for exposing said at least one oxidizable layer.

9. The method according to claim 7, wherein said at least one semiconductor layer is at least one AlGaInP layer.

10. The method according to claim 7, wherein said at least one semiconductor layer is at least one low aluminum-contained AlGaAs layer.

11. The method according to claim 7, wherein said oxidizable layer is a high aluminum-contained AlGaAs layer.

12. The method according to claim 11, wherein a portion of said oxidizable layer is oxidized to form a current insulating layer after a treatment of oxidation.

13. The method according to claim 11, wherein the aluminum composition of said at least one oxidizable layer is between about 80% and about 100%.

14. The method according to claim 11, wherein a current insulating layer is formed by oxidizing said at least one oxidizable layer at a temperature between about 300 and about 600 degree C.

15. A structure of a light emitting diode, comprising:
    a substrate having a first surface on one side a second surface on the other side, wherein a first electrode has been formed on said first surface;
    an epitaxial structure forming on said second surface, wherein said epitaxial structure is formed by a plurality of III-V compound semiconductor epitaxial layers including an active layer and a Bragg reflector layer sandwiched between said active layer and said substrat, and said Bragg reflector layer comprises:
       at least one oxidizable layer, wherein a portion of said at least one oxidizable layer is oxidized, thereby forming a current insulating layer, and said at least one oxidizable layer is at least one high aluminum-contained AlGaAs layer, and the aluminum composition of said at least one oxidizable layer is between about 80% and about 100% and at least one semiconductor layer, wherein said at least one semiconductor layer and said at least one oxidizable layer are stacked each other; and a second electrode formed on said epitaxial structure.

16. The structure according to claim 15, wherein said at least one semiconductor layer is at least one AlGaInP layer.

17. The structure according to claim 15, wherein said at least one semiconductor layer is at least one low aluminum-contained AlGas layer.

* * * * *